(12) United States Patent
Svirchevski et al.

(10) Patent No.: US 6,170,110 B1
(45) Date of Patent: Jan. 9, 2001

(54) APPARATUS FOR HF-HF CLEANING

(75) Inventors: Julia Svirchevski, Santa Clara; Katrina Mikhaylich, San Jose; Jackie Zhang, Cupertino, all of CA (US)

(73) Assignee: Lam Research Corporation, Fremont, CA (US)

(*) Notice: Under 35 U.S.C. 154(b), the term of this patent shall be extended for 0 days.

(21) Appl. No.: 09/611,235

(22) Filed: Jul. 6, 2000

Related U.S. Application Data (62) Division of application No. 09/183,568, filed on Oct. 30, 1998, now Pat. No. 6,093,254.

(51) Int. Cl.⁷ .................. B08B 1/04; B08B 3/00
(52) U.S. Cl. .................. 15/77; 15/88.3; 15/102; 15/21.1
(58) Field of Search .............. 15/21.1, 24, 50.3, 15/77, 88.3, 88.4, 97.1, 102, 103.5

(56) References Cited

U.S. PATENT DOCUMENTS

| | | | |
|---|---|---|---|
| 986,531 | * 3/1911 | Wilson | 15/24 X |
| 1,611,874 | * 12/1926 | Becker | 15/24 |
| 2,253,539 | * 8/1941 | Steinhilber | 15/88.3 X |
| 2,757,406 | * 8/1956 | Decker | 15/24 X |
| 3,044,227 | * 7/1962 | Charvat | 15/21.1 X |
| 4,008,503 | * 2/1977 | Tharp | 15/88.3 |
| 4,177,532 | * 12/1979 | Azuma | 15/24 |
| 4,811,443 | * 3/1989 | Nishizawa | 15/102 X |
| 5,806,126 | * 9/1998 | De Larios et al. | 15/102 |
| 6,070,284 | * 6/2000 | Garcia et al. | 15/102 |

FOREIGN PATENT DOCUMENTS

50703 * 1/1910 (CH) .................. 15/24

* cited by examiner

*Primary Examiner*—Mark Spisich
(74) *Attorney, Agent, or Firm*—Martine Penilla & Kim, LLP (57) ABSTRACT

The present invention describes a method and apparatus used in a substrate cleaning system wherein a substrate is placed into a first brush station while a chemical solution is delivered to the first brush station at a desired concentration level. The substrate is then scrubbed in the first brush station. After the substrate is scrubbed in the first brush station the substrate is transferred to a second brush station. The chemical solution used in the first brush station is then delivered to a brush in the second brush station in a ramp up manner in order to clean the brush in the second brush station. The delivery of the chemical solution to the second brush station is then stopped and deionized water is delivered to the second brush station. The substrate is then scrubbed using the deionized water in order to rinse the chemical solution from the substrate prior to transferring the substrate from the second brush station to another processing station. This method and apparatus applies the chemical solutions uniformly to the semiconductor substrate, reduces the volumes of chemical solutions used in a scrubbing process, and helps maintain control of the pH profile of a substrate. This system is described and illustrated in the manner it is used in conjunction with a scrubber that scrubs both sides of a semiconductor substrate.

3 Claims, 5 Drawing Sheets

APPARATUS FOR HF-HF CLEANING

This is a Divisional application of prior application Ser. No. 09/183,568 filed on Oct. 30, 1998, U.S. Pat. No. 6,093,254.

BACKGROUND OF THE INVENTION

1. Field of the Invention

This invention relates to methods of processing a substrate, and more specifically, to a method and apparatus for the delivery of chemical solutions during the cleaning process of, for example, semiconductor substrates.

2. Background Information

In the manufacture of semiconductor devices, the surface of semiconductor substrates must be cleaned of substrate contaminants. If not removed, substrate contaminants may affect device performance characteristics and may cause device failure to occur at faster rates than usual.

A scrubber that scrubs a substrate on either one or both sides may be used to remove substrate contaminants. The type of cleaning solution (solution) used in the scrubber may depend upon the type of contaminants to be removed, the particular type of substrate to be scrubbed, and/or the particular manufacturer's preferred method for cleaning. For example, some manufacturers require a low level of contamination and may use a chemical solution for scrubbing, while other manufacturers have a higher contamination tolerance (i.e. less contamination need be removed) and use water for scrubbing.

As the type of solution depends upon manufacturing requirements, similarly, the method or apparatus used to deliver that solution may depend upon the manufacturer's requirements and the type of solution being used. Submersing the substrate in the solution, spraying the solution on the substrate, and dripping the solution on the substrate or the brush are examples of methods used to deliver the solution for scrubbing. The drip delivery system is described in U.S. Pat. No. 5,723,019 titled "Drip Chemical Delivery Method and Apparatus," issued on Mar. 3, 1998, and assigned to the assignee herein. Each of these methods have their advantages and disadvantages.

Submersing the substrate in the solution requires large volumes of chemical solutions. Some of the solutions, for example, $NH_4OH$, can be expensive and toxic to use. Thus, reducing the volume of solution used is desired.

Spraying the substrate also uses large volumes of solutions. Another disadvantage to spraying is that there is very little control over the chemical composition at the substrate surface. For example, some systems and process may use relatively quick bursts of high pH solutions, such that the pH profile of the surfaces may change rapidly and may not be easily controlled. If the pH profile of the surface is not controlled damage may result to the substrate.

Dripping the solution on the substrate or brush uses smaller volumes of the solution, but may result in nonuniform delivery of the solution. Thus, only the areas of the substrate where the solution was dripped may be cleaned. Also, dripping the solution on the substrate may damage the substrate, depending upon the reactivity of the solution. Some solutions may react as soon as they hit the substrate surface and may cause "grooves" or "holes" to be formed where the solution is dripped onto the substrate. Other solutions, for example $NH_4OH$, do not react as quickly and do not damage the substrate.

It has also recently become possible to perform chemical etch processes at the same time that the semiconductor substrate is being cleaned or scrubbed. One such process is described in U.S. Pat. No. 5,806,126 titled "Apparatus for a Brush Assembly," issued on Sep. 15, 1998, and assigned to the assignee herein. The process described in U.S. Pat. No. 5,806,126 ('126 Patent) is a combined ammonium hydroxide ($NH_4OH$) and hydrofluoric acid (HF) cleaning and etch process. A substrate is first scrubbed in a first brush station using a solution of $NH_4OH$ to remove particulate contaminants and then the substrate is transported into a second brush station for an etch/cleaning process using HF.

Using the method described in the '126 Patent, particulate contamination is removed in the first brush station using $NH_4OH$. $NH_4OH$ is used to change the zeta potential between the surface of the substrate and the contaminants. The zeta potential is related to the surface energy or "charge" at the surface of the substrate and contaminants. $NH_4OH$ changes the zeta potential such that the contaminants and substrate surface have potentials which are of like charges. As is well known in science, like charges repel like charges. Thus the substrate surface and contaminants repel one another, thereby removing the contaminants from the substrate surface.

Figure 1:
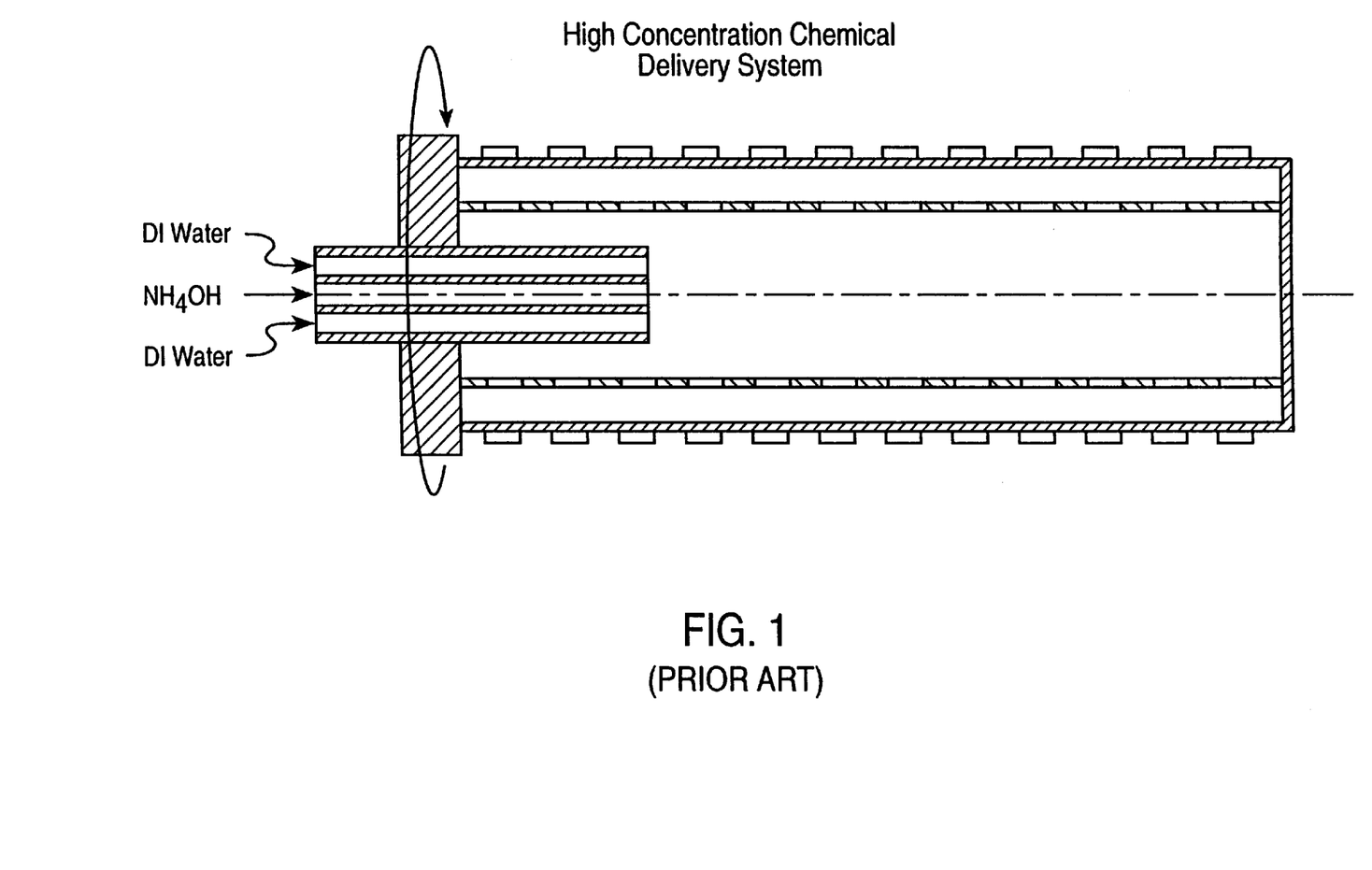
FIG. 1 illustrates a prior art high concentration chemical delivery system.

$NH_4OH$ is applied to the substrate using the delivery system illustrated in FIG. 1. This delivery system is referred to in the '126 Patent as a high concentration delivery system. The high concentration delivery system has two delivery tubes: one for delivery of the $NH_4OH$ solution and another for delivery of deionized water (DI water). The two delivery tubes are operated such that the deionized water remains turned on and the chemical solution is turned on and off, depending upon when the user wants the chemical solution applied to the substrates. In other words, when $NH_4OH$ is being used (i.e., turned on) the DI water is turned off and when $NH_4OH$ is not being used (i.e., turned off) the DI water remains turned on.

When a substrate is transported into the first brush station for cleaning with the $NH_4OH$ solution, the DI water which has been running to keep the brush moist is remains on and the $NH_4OH$ solution is also turned on. The substrate is scrubbed for a period of time (which is selected by the user) and then the $NH_4OH$ solution is turned off and the DI water remains on. The DI water remains on after scrubbing with the $NH_4OH$ solution in order to rinse the substrate (and the brush) to remove any extraneous $NH_4OH$ that may be on the substrate before the substrate is transported into the next brush station. Such a process creates a chemical profile as illustrated in FIG. 2a.

Figure 2A:
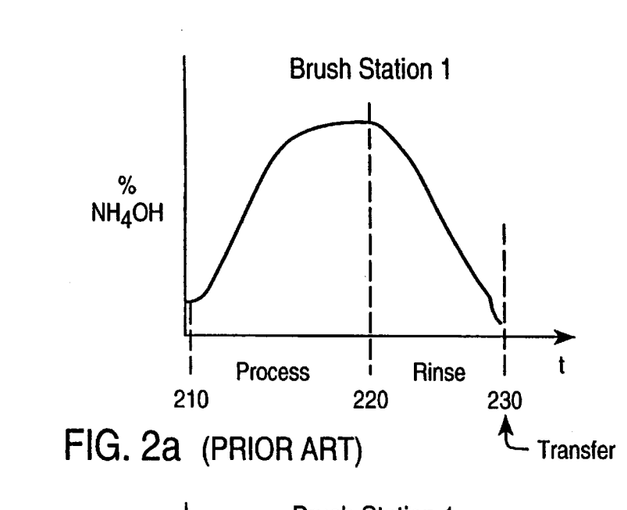
FIG. 2a illustrates a chemical profile of the brushes and substrate surface in the first brush station using a prior art cleaning process.

As illustrated in FIG. 2a, the chemical profile on the substrate is uneven and takes a considerable amount of time before the desired amount of $NH_4OH$ is delivered to the substrate. At time 210, the substrate has been placed into the first brush station, the $NH_4OH$ solution is turned on, while the DI water remains on to prevent a high concentration of $NH_4OH$ solution from being delivered directly to the substrate. The cleaning process with $NH_4OH$ is performed from time 210 to 220. At time 220, the cleaning process ends and the rinse process begins by turning off the $NH_4OH$ solution and leaving the DI water turned on.

FIG. 2a also illustrates the amount of time necessary to run such a process. The $NH_4OH$ cleaning process is long because it takes a significant amount of time to reach the desired level of $NH_4OH$ (ramp up) and it also takes a significant amount of time to rinse the substrate before the substrate can be transported to the next brush station for the next process (i.e., the HF etch/cleaning process). It should be noted that in order to increase the cleaning of the substrate the only way to do so is to increase the length of time that the substrate is being scrubbed in the first brush station. Thus, the time for cleaning (i.e., 210–220) may be longer than illustrated in FIG. 2a. It should be noted that increasing the concentration of the NH$_4$OH solution does not necessarily increase the cleaning. Additionally, if the concentration of the NH$_4$OH solution is increased such an increase may affect the pH profile on the surface of the substrate and could potentially damage the substrate.

It should also be noted that in order to reach the desired level of NH$_4$OH, the ramp up sequence requires large amounts of the NH$_4$OH solution. Using large amounts of chemicals can become costly because some chemicals used in semiconductor substrate cleaning may be more expensive than others.

After the substrate has been rinsed the substrate is transferred at time 230 to the second brush station for the HF etch/cleaning process. Using the method described in the '126 Patent, HF is used to remove a portion of the substrate surface. Because HF is such a highly reactive chemical it is desirable to use HF in lower concentrations in order to control the etch process.

Figure 3:
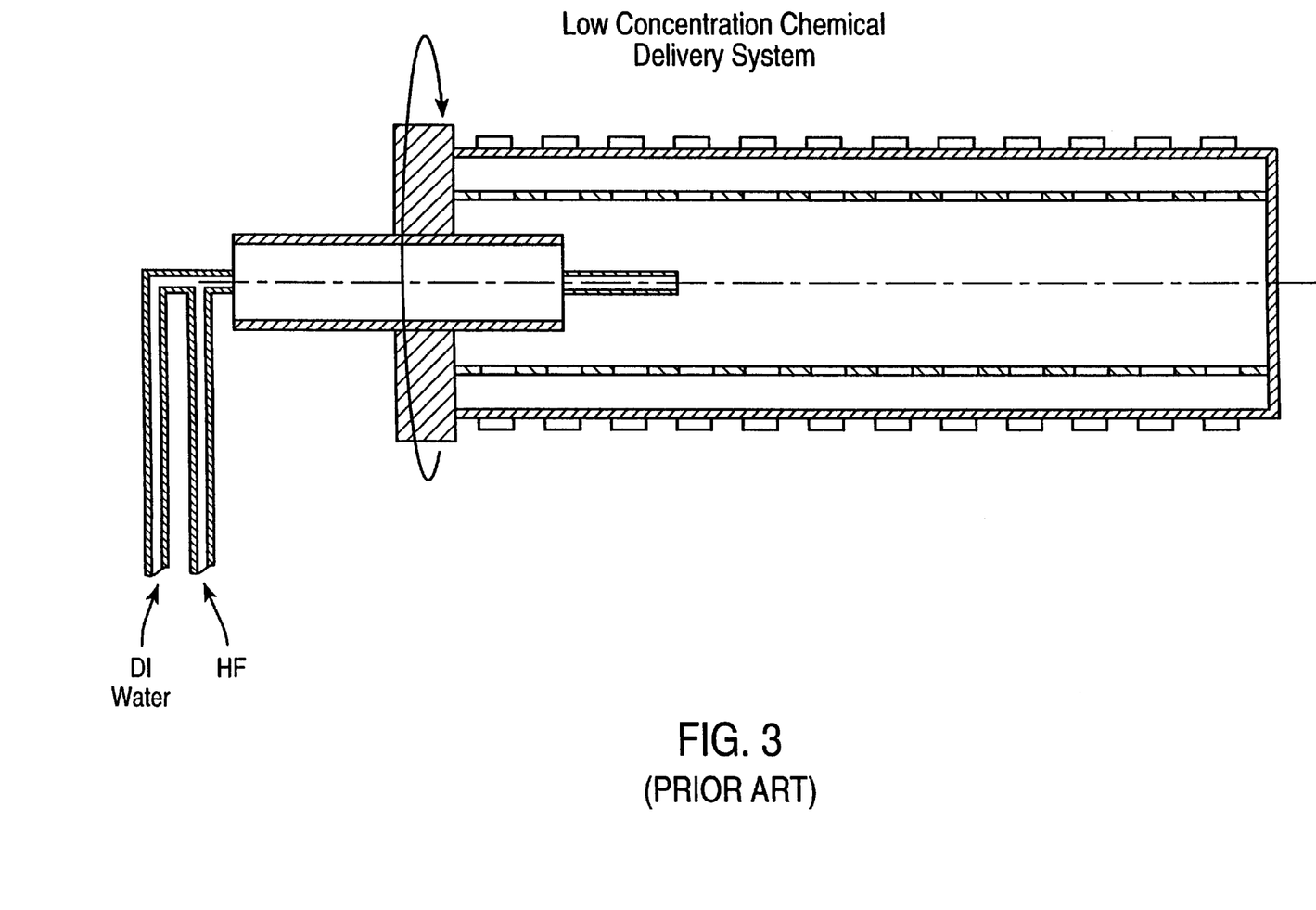
FIG. 3 illustrates a prior art low concentration chemical delivery system.

HF is applied to the substrate using the delivery system illustrated in FIG. 3. This delivery system is referred to in the '126 Patent as a low concentration delivery system. The low concentration delivery system has two delivery tubes: one for delivery of the premixed HF solution and another for delivery of de-ionized water (DI water). The two delivery tubes are operated at different times and when one of the delivery tubes is turned on the other delivery tube is turned off. In other words, when premixed HF solution (HF solution) is being used (i.e., turned on) the DI water is turned off and vice versa.

When a substrate is transported into the second brush station for etching with the HF solution, the DI water which has been running to keep the brush moist is turned off and the HF solution is turned on. The substrate is scrubbed for a period of time (which is selected by the user) to etch the substrate such that the desired amount of surface material is removed. Once the etch is complete the HF solution is turned off and the DI water is turned back on. The DI water is turned on after scrubbing with the HF solution in order to rinse the substrate (and the brush) to remove any extraneous HF that may be on the substrate before the substrate is transported out of the second brush station and into another process station. Such a process creates a chemical profile as illustrated in FIG. 2b.

Figure 2B:
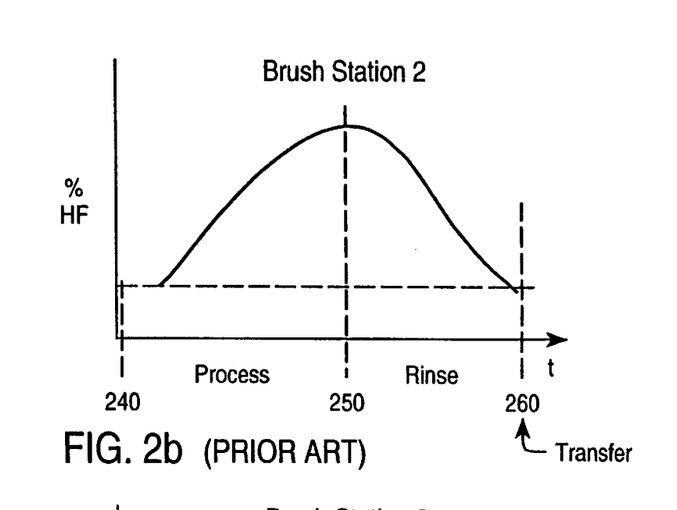
FIG. 2b illustrates a chemical profile of the brushes and substrate surface in the second brush station using a prior art cleaning process.

As illustrated in FIG. 2b, the chemical profile on the substrate and brushes is uneven and takes a considerable amount of time before the desired amount of HF is delivered to the substrate. At time 240, the substrate has been placed into the second brush station, the HF solution is turned on, and the DI water is turned off. The HF is dispensed from time 240 to 250. At time 250, the HF dispense ends and the rinse process begins by turning on the DI water and turning off the HF solution.

FIG. 2b also illustrates the amount of time necessary to run such a process. The HF etching process is long because it takes a significant amount of time to reach the desired level of HF and it also takes a significant amount of time to rinse the substrate before the substrate can be transported to the next process station for the next process (e.g., the rinse, spin, and dry station). It should be noted that depending upon the amount of material that the user desires to be removed (or etched), the process time will vary. In other words, the greater the amount of material that is to be etched from the surface of the substrate the longer the etch process time (i.e. the longer the time from 240–250).

It should be noted that, increasing the concentration of the HF may also increase the amount of material that is etched. However, increasing the concentration of the HF solution decreases the control over the etch process due to the highly reactive nature of HF. Thus, due to the potential of damaging the substrate it is not desirable to increase the concentration of the HF solution.

Additionally, as with the NH$_4$OH solution ramp up, the sequence for the HF solution ramp up tends to require large amounts of the HF solution. HF solution is an expensive chemical and is also a potentially harmful chemical. Thus, it would be desirous to use less of such costly and potentially harmful chemicals.

At time 260 the substrate is then transferred out of the second brush station and into the next process station. However, as can be seen in the chemical profile of FIG. 2b, the substrate will still have some HF solution on its surface. Transferring the substrate into the next process station will potentially expose that process station to the highly reactive HF solution. The HF solution could potentially damage the next process station due to its corrosive nature and high reactivity. However, the only other alternative to transporting the substrate while some HF solution remains on the substrate is to increase the rinse time in the second brush station. Increasing the rinse time in the second brush station has drawbacks in that either the etch time has to be reduced or the total process time used in the second brush station must be increased in order to account for the longer rinse. Reducing the etch time reduces the amount of material that can be etched and leads to poor metal contamination performance on the substrate. Increasing the total process time of the second brush station is also not desirable since such an increase increases the total process time of the entire cleaning process and reduces throughput of the system.

Thus, what is needed is a method and apparatus, for cleaning and etching substrates that may be used in existing scrubbers, that apply the solutions in a manner that increases the throughput of the system, but that does not use large amounts of chemicals.

SUMMARY OF THE INVENTION

The present invention describes a method and apparatus used in a substrate cleaning system wherein a substrate is placed into a first brush station while a chemical solution is delivered to the first brush station at a desired cleaning level. The substrate is then scrubbed in the first brush station. After the substrate is scrubbed in the first brush station the substrate is transferred to a second brush station. The chemical solution used in the first brush station is then delivered to a brush in the second brush station in a ramp up manner in order to clean the brush in the second brush station. The delivery of the chemical solution to the second brush station is then stopped and deionized water is delivered to the second brush station. The substrate is then scrubbed using the deionized water in order to rinse the residuals of the chemical solution from the substrate prior to transferring the substrate from the second brush station to another processing station.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Method and Apparatus for HF—HF Cleaning is disclosed. In the following description, numerous specific details are set forth such as specific materials, process steps, process parameters, solutions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention may be employed in a number of substrate cleaning procedures. Although the present invention is described in conjunction with the scrubbing of a substrate, it will be appreciated that any similarly shaped, i.e. generally flat substrate, may be processed by the methods and apparati of the present invention. Further, it will be appreciated that reference to a substrate or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, substrates having dielectric layers, or substrates for processing other apparati and devices such as flat panel displays, multichip modules, etc. However, to avoid obscuring the invention the following description will describe substrate cleaning in general and as an example of one embodiment will describe the use of the present invention in a scrubbing process.

HF—HF Cleaning/Etching Process

As an example, and not by limitation, the present invention is described in conjunction with a scrubbing process, more specifically, a scrubbing process in which both sides of the substrate are scrubbed. The scrubber includes a number of stations. Each of these stations represents one or more steps in the substrate cleaning process. Contaminated substrates are loaded at one end of the system and cleaned and dried substrates are unloaded from the other end of the system. Examples of systems of this type are the DSS-200™ Scrubber and Synergy Scrubber available from OnTrak Systems, Inc. of Milpitas, Calif.

Figure 4:
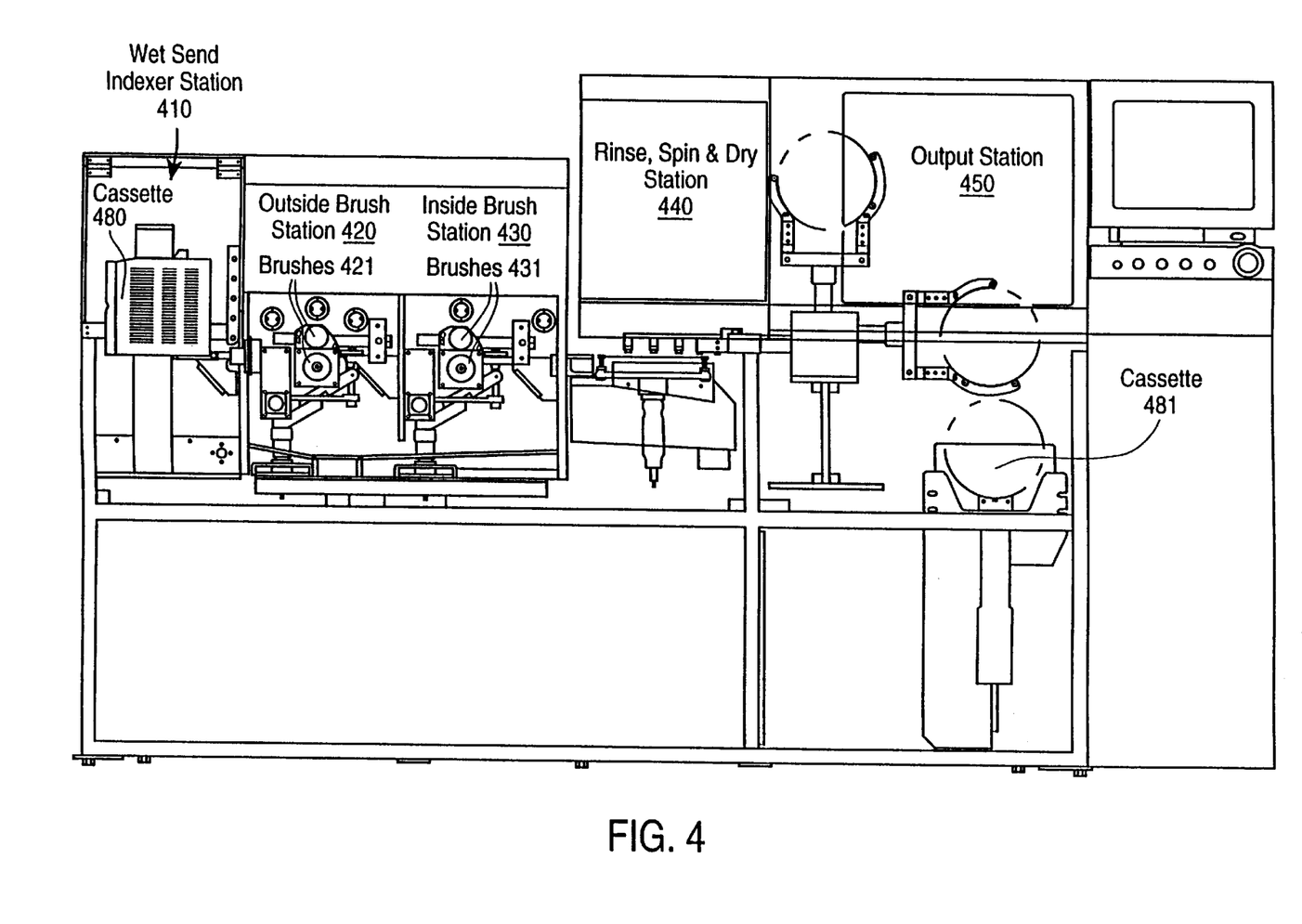
FIG. 4 represents a cross sectional view of a DSS-200™ Scrubber or Synergy Scrubber configuration.

FIG. 4 represents a cross sectional view of a DSS-200™ or Synergy Scrubber configuration (cleaning system). Usually, the contaminated substrates are delivered to the cleaning system after chemical mechanical polishing (CMP), from a wet bench, or from other processes resulting in contamination. At the start of the cleaning process contaminated substrates are loaded into a substrate cassette 480 (cassette) and the cassette 480 is then placed into the wet send indexer station 410. After cassette 480 is placed into wet send indexer station 410 the substrates are automatically removed from the cassette 480 and placed, one at a time, into the outside brush station 420.

In the outside brush station 420 a substrate is processed through a first scrub. In one embodiment of the present invention, the substrate is etched/cleaned with hydrofluoric acid (HF) solution during the first scrub. The HF solution is applied to the substrate through brushes 421. Delivery of the HF chemical solution through the brushes is discussed in detail below, following the description of the cleaning/etch process.

As previously discussed, the substrates are often delivered to the cleaning system after chemical mechanical polishing or the like to be cleaned. An etch process may also be performed to remove a portion of the surface of the substrate. The surface of the substrate to be etched may be an interlayer dielectric, for example silicon dioxide, a metal etch, for example copper, or another material that may be removed using an etch technique. Previously, a first cleaning process was performed to remove particulate contamination, then a separate etch process was performed to remove a portion of the surface of the substrate and reduce metallic contamination. Such a process has disadvantages as discussed in the background section above.

In the process of the present invention the cleaning step to remove the particulate contamination and etch to remove a portion of the substrate surface are performed simultaneously without the need for an extra particulate contamination cleaning step and without the introduction of another chemical solution. The substrate is delivered to the outside brush station 420 from the wet send indexer station 410. When the substrate is delivered to the outside brush station 420, the HF chemical solution is already being delivered through the brushes 421 and is already at the desired concentration level. In one embodiment of the present invention the HF chemical solution is delivered to the outside brush station 420 with a concentration in the range of approximately 0.5–5 weight percent.

By using concentrations of the HF solution on the order of approximately 0.5–5 weight percent, the present invention is able to establish a charge repulsion effect as established with the prior art process using ammonium hydroxide discussed above. Additionally, such concentrations of the HF solution enables the HF solution to dissolve particles, placing the particles into soluable form, and allowing the dissolved particle to be rinsed away. Thus, the HF chemical solution is used to remove particulate contamination. While removing the particulate contamination though, because of the reactive nature of the HF solution, the substrate may also be etched to remove unwanted surface layers or portions thereof. Therefore, the HF solution may simultaneously clean the substrate of particulate contaminants and etch the substrate surface, hence the clean/etch process.

In the present invention the brushes 421 are not rinsed with water before the substrate is placed into the outside brush station 420. Since brushes 421 have not been rinsed the brushes will still have the chemical solution on them, thus there is no need to ramp up the chemical solution as is needed in the prior art process described above. Since the HF chemical solution is already on the brushes at the desired concentration there is not a "dump" of chemicals on the substrate all at once, but rather is a smooth controlled application of the HF chemical solution to the substrate at a constant concentration. The lack of a ramp up process also means that time required to perform the simultaneous etch and clean would be reduced. In other words, the process performed in the brush station 420 using the process of the present invention would require less time than the prior art cleaning process performed in the first brush station described above. Such a shorter process increases the throughput of the system 400.

Figure 6A:
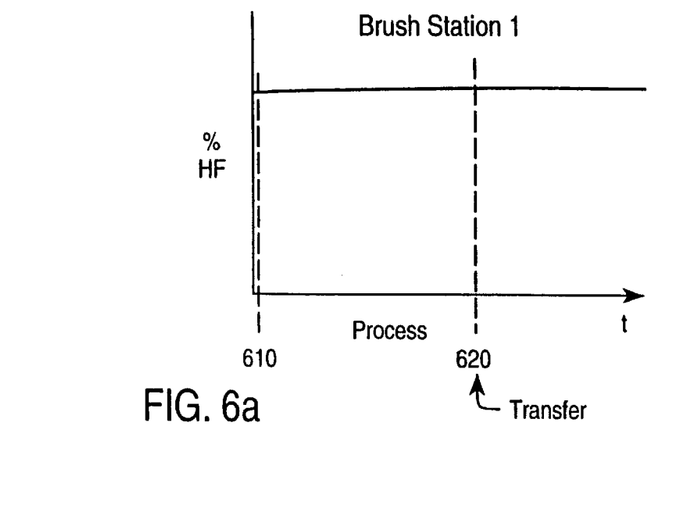
FIG. 6a illustrates a chemical profile of the brushes and substrate surface in the first brush station using an embodiment of the cleaning process of the present invention.

FIG. 6*a* illustrates the chemical profile on the brushes 421 and the substrate in the outside brush station 420 using the process of the present invention. At time 610, the substrate is placed in the outside brush station 420 and the pH level of the HF solution is already at the desired active cleaning level (or concentration), so the cleaning and etch process starts immediately. The substrate is scrubbed with the HF solution until the substrate has reached the desired level of cleanliness and/or the desired amount of the substrate surface has been etched (or removed). At time 620, the clean/etch process in the outside brush station/stops, however, rather than starting a rinse cycle as would be performed in the prior art process discussed above the present invention transports the substrate directly into the next brush station, i.e., inside brush station 430, without a rinse in the outside brush station 420.

The lack of a rinse cycle in the outside brush station 420 also saves time compared to the prior art process where a rinse cycle is performed before transferring the substrate to the next brush station. There is no need for a rinse in the outside brush station 420 with the present invention because the same chemical solution is being used in both brush stations. In one embodiment, as the substrate is being transferred out of the outside brush station 420, the chemical solution is stopped in order to conserve the amount of chemical solution that is used. Even though the chemical solution delivery is stopped the chemical solution concentration on the brush remains at an active cleaning level since the brush is not rinsed, and thus there is still no need for a ramp up sequence. In another embodiment as the substrate is being transferred out of the outside brush station 420, the chemical solution is still being delivered to the outside brush station at the same concentration level. The delivery of the chemical solution may be continued so that the brush station will be ready for the next substrate to be placed in the outside brush station 420 to be cleaned/etched and so that the brushes 421 will not have the opportunity to dry out since a rinse is not performed.

It should be noted that the only time the brushes in the outside brush station are rinsed is when an idle sequence is entered. The outside brush station 420 may enter an idle sequence after a preset time period has elapsed without a substrate being transported into the outside brush station. The preset time period before the idle sequence is usually set by the user based upon their desired throughput of the system 400. If an idle sequence is entered in the outside brush station 420, the chemical solution flow is stopped (if it has not already been stopped) and just deionized water is delivered to the brushes of the outside brush station. The delivery of deionized water helps to keep the brushes moist during an idle sequence. In one embodiment of the present invention PVA brushes are used which are made of a porous material. Thus, running deionized water during idle sequences keeps the brushes moist and keeps them from drying out and extends the lifetime of the brush.

After an idle sequence and before another substrate is transferred into the outside brush station 420 a ramp up sequence is performed to bring the delivery of the chemical solution to the desired concentration (or pH) level. This ramp up is performed relatively quickly and is not repeated every time a substrate is transferred into the outside brush station thus such a ramp up does not significantly decrease the throughput of the system 400.

At time 620, the scrubbed substrate is then automatically removed from the outside brush station 420 and placed into the inside brush station 430. In the inside brush station 430, the substrate is processed through a second scrub. In one embodiment, the same chemical solution, for example HF, used in the outside brush station 420 is delivered to the inside brush station 430 through the brushes 431. The delivery of the chemical solution is only performed for a short period of time so that the brushes 431 may be cleaned. Then the delivery of the chemical solution is stopped and deionized water is delivered to the outside brush station 430 in order to rinse the chemical solution from the substrate.

Figure 6B:
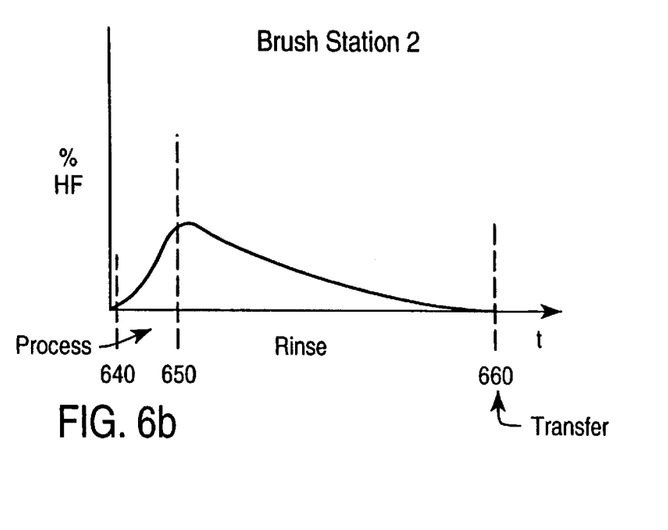
FIG. 6b illustrates a chemical profile of the brushes and substrate surface in the second brush station using an embodiment of the cleaning process of the present invention.

FIG. 6*b* illustrates the chemical profile of the brushes 431 and the surface of the substrate in the inside brush station 430. At time 640, the substrate is transported into the inside brush station 430. If the throughput of the system 400 is set up such that when one substrate is transferred out of the inside brush station 430 another substrate is transferred into the inside brush station 430, without much of a delay, the delivery of the chemical solution to the inside brush station requires a ramp up sequence to attain the desired concentration (or pH) level. In one embodiment of the present invention the chemical solution is only delivered to the inside brush station 430 in order to clean the brushes 431. Adjusting the pH level of the brushes establishes the electrostatic potential (described earlier) between the brushes 431 and any potential contaminants causing the brushes and contaminants to repel one another, thus cleaning the brushes. The HF solution may also dissolve some of the contaminants, placing the contaminants into a soluable form that can be rinsed away. The ramp up sequence is performed from time 640 to 650, a relatively short portion of the time that processing is performed in the inside brush station 430.

At time 650, the delivery of the chemical solution is stopped and the delivery of deionized water is begun. During the second scrub the substrate is rinsed with the deionized water to remove any of the remaining chemical solution from the first scrub performed in outside brush station 420 and from the ramp up sequence performed in the inside brush station 430. As in the first scrub step, the deionized water is applied to the substrate through brushes 431. Delivery of the chemical solution for the ramp up sequence and the deionized water for the rinse may be performed using the delivery system described in detail below. It should be noted that other delivery systems such as the prior art systems described previously may also be used in the inside brush station 430 since a ramp up sequence is used.

The second scrub or rinse may be performed for a longer period of time than in the prior art processes described above because the etch was already performed in the outside brush station 420. Thus, in the present invention the rinse can be performed to remove the chemical solution from the substrate such that very little (if any) of the chemical solution would remain when the substrate is transferred out of the inside brush station 430 and into the next processing station. Also, since the etch was already performed in outside brush station 420, increasing the rinse time in the inside brush station 430 does not decrease the throughput of the system 400. In fact, even though the rinse sequence is longer in the present invention the total system time may still be reduced using the present invention as compared to the total system time of the prior processes.

After the second scrub (i.e., the rinse sequence), at time 660, the substrate is then automatically removed from the inside brush station 430 and placed into the next processing station. In one embodiment of the present invention the substrate is transferred into the rinse, spin and dry station 440. Because the rinse sequence of the inside brush station 430 is relatively long (compared to the prior art processes) the potential for damage to the rinse, spin, and dry station 440 from the chemical solution is greatly reduced. Rinse, spin, and dry station 440 rinses, spins, and dries the substrate. At this point the substrate has been etched and cleaned.

Once the rinse, spin, and dry steps have been completed the substrate is then transported from the rinse, spin, and dry station 440 to the output station 450 where the substrate will be placed into cassette 481. The transfer is usually carried out by a robotic arm which lifts the substrate out of the rinse, spin, and dry station 440 by its edges and places it into the cassette 481. The cassette is then transferred to storage or to another cleaning or processing system.

It should be that other methods for rinsing the brush and substrate, for example spraying with deionized water, are also available. It should also be noted that although the present invention is described above with respect to an HF solution, the present invention may also be practiced with other chemical solutions, for example, citric acid, ammonium citrate, SC1, ammonium hydroxide, hydrogen chloride, chelating agents, surfactants, chemical mixtures, etc.

An advantage of the present invention is that if a user desires to etch (or remove) a greater amount of the substrate surface there are a couple of possible ways this could be accomplished using the process of the present invention. One such way, is that the user could run the process in the outside brush station for a longer period of time. Running the process of the present invention for a longer period of time would not decrease the throughput of the system too greatly since the process of the present invention does not require the "ramp up" time that is required by previous processes. Thus, even by running the process of the present invention for a longer period of time would not significantly increase the total system time any greater than the total system time already was for the previous processes.

Another way that the amount of the etch may also be increased in the present invention is by increasing the concentration of the chemical in the chemical solution. Increasing the concentration is available as part of the present invention due to the configuration of the chemical delivery system discussed in greater detail below. Thus, the concentration of the chemical solution may be increased to increase the etch rate without increasing the amount of time the process in the outside brush station 420 needs to be performed.

Another advantage of the present invention is the flexibility of the duration of the etch and rinse sequences without decreasing the overall system throughput as compared to the prior art processes. In other words, the duration of the etch may be increased to remove more of the substrate surface or the rinse sequence may be increased to remove the chemical solution from the substrate before transferring the substrate to the next processing station without increasing (or greatly increasing) the total processing time of the system because the present invention only requires one chemical solution process and one rinse sequence whereas the previous processes required ramp up sequences, two chemical solution processes, and two rinse sequences.

Still another advantage of the present invention is the decrease in the amount of water used to process a substrate. Because the number of rinse cycles are substantially decreased so is the amount of water consumed. Additionally, the present invention reduces the required incoming deionized water pressure from that of the prior processes described above.

Yet another advantage of the present invention is that the amount of chemicals used is substantially decreased due to the fact that the total number of ramp up sequences is reduced as compared to the prior art processes. Decreasing the amount of chemicals used decreases the overall cost of the cleaning/etch process.

Apparatus for Delivery of Chemicals

In the background of the invention, a low concentration delivery system and a high concentration delivery system are discussed. Another delivery system described herein may also be used with the present invention. This new delivery system has the advantage of greater control over the concentration of the chemical solution and also does not require premixing of the chemical solution.

Figure 5:
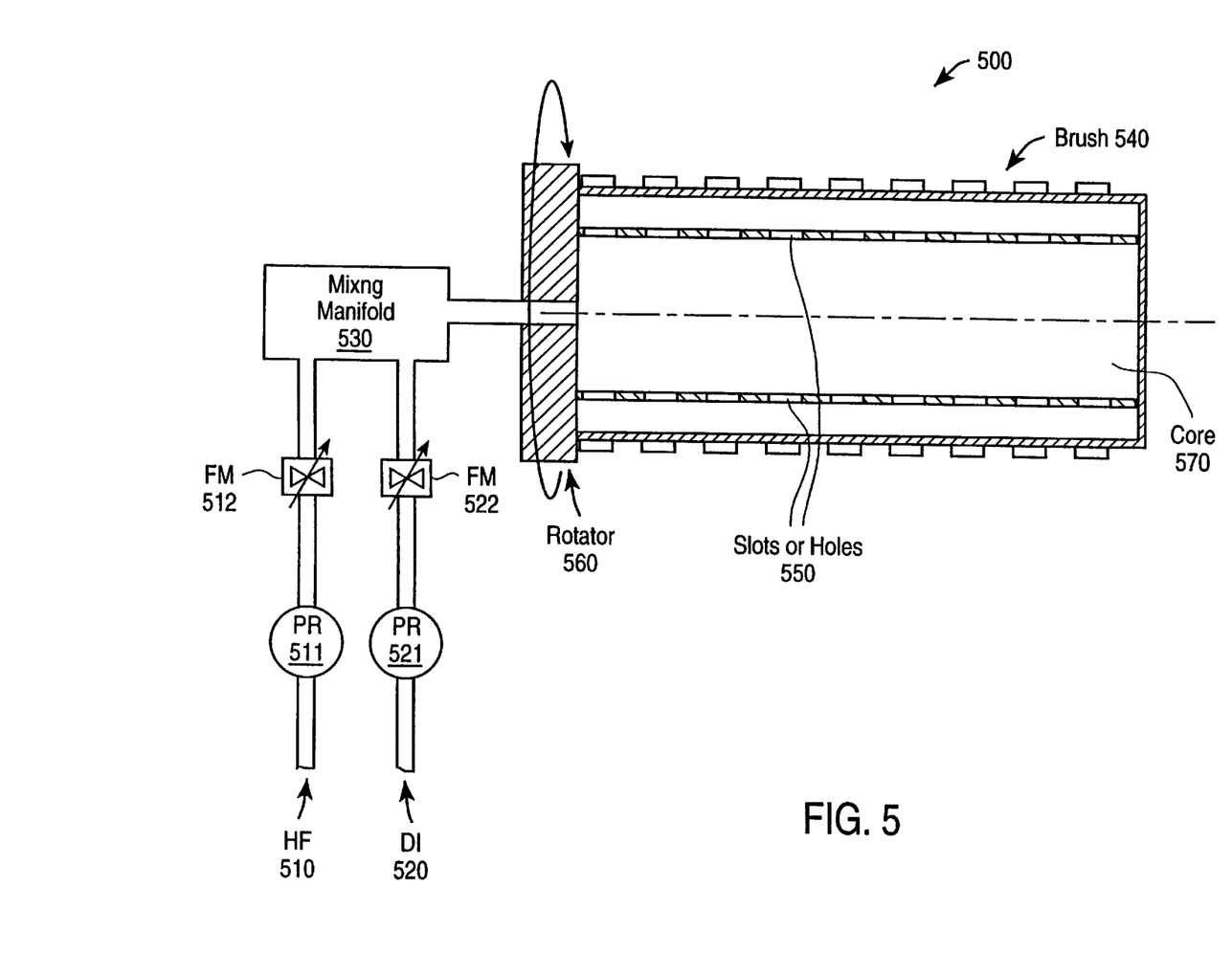
FIG. 5 illustrates an embodiment of an embodiment of a chemical delivery system used in the present invention.

FIG. 5 illustrates an embodiment of a chemical delivery system 500. In the embodiment of chemical delivery system 500, shown in FIG. 5, there are two separate delivery tubes: one tube for delivering a chemical, for example HF, (i.e. delivery tube 510) and another tube for delivering water, for example deionized water (i.e. delivery tube 520). Attached to each delivery tube, 510 and 520, is a separate pressure regulator, 511 and 521, and fluid meter, 512 and 522, respectively. Providing separate delivery tubes, pressure regulators, and fluid meters for the chemical, for example HF, and the deionized water allows the pressure and flow rate of the HF to be controlled separately from the pressure and flow rate of the deionized water.

Delivery tubes 510 and 520, deliver the chemical, HF, and deionized water to a mixing manifold 530 where the chemical and deionized water are blended (or mixed) to achieve the desired concentration of the chemical solution. Regulating the pressure and flow rate of the chemical and the pressure and flow rate of the deionized water allows the user to adjust the concentration of the chemical solution that is being mixed in the mixing manifold 530. Thus, the chemical delivery system 500 does not require the use of premixed chemical solutions.

In one embodiment the flow rate of deionized water ranges from approximately 0 to 1000 milliliters per minute, the pressure of deionized water ranges from approximately 30 to 55 psi, the flow rate of HF ranges from approximately 0 to 1000 milliliters per minute, and the pressure of HF ranges from approximately 5 to 20 psi in order to achieve chemical solution concentrations in the range of approximately 0.5 to 5 percent. It should be noted that either delivery tube may be turned on or off at any time and also that other flow rates and concentrations may be used as desired by a particular user.

It should be noted that the size of the delivery tubes may vary according to the desired concentrations, volumes, and flow rates for the particular cleaning process. After the chemical solution is blended in mixing manifold 530 the chemical solution is then delivered to the brush in one of the brush stations.

As shown in FIG. 5, the chemical solution is delivered directly into the hollow core 570 of brush 540 in delivery system 500. It should be noted that hollow core 570 may be comprised of a simple space, tubing, channels, pockets, etc.

The chemical solution may then be distributed (or applied) in uniform concentrations to the substrate by brush 540.

The brush 540 may generally be selected from two types of brushes: bristle and sponge brushes. In one embodiment of the present invention, PVA sponge brushes are used. The chemical solution (for example, the HF solution) is distributed to the brushes such that the brushes are evenly soaked (or saturated) with the chemical solution. In the embodiment illustrated in FIG. 5 the brushes are saturated with the chemical solution by absorbing the solution through the slots (or holes) 550 in the outer rim of hollow core 570. It should be noted that other implementations and devices may be used to evenly soak the brushes, for example, baffles or channels may be used.

As brush 540 is being saturated with the chemical solution it is rotated by rotation device 560. Rotation device 560 turns brush 540 in a clockwise (or counterclockwise) manner, thereby applying the chemical solution to the substrate while scrubbing the substrate to remove contaminants and etch the surface. Because brush 540 is saturated with the chemical solution the solution is uniformly applied to the substrate. Uniform distribution of a chemical solution is essential to control the pH level on the substrate surface. Nonuniform distribution of the chemical solution can cause poor or reduced contamination removal and etch disparities in localized areas on the substrate surface.

The above described chemical delivery system (i.e. chemical delivery through the brush with pressure regulators) apply chemical solutions in a uniform manner to the semiconductor substrate, reduce the volumes of chemical solutions used in a scrubbing process, help maintain control of the pH profile of a substrate during scrubbing, and enable the user to change the concentration of the chemical solution easily and without having to premix the chemical solutions.

It should be noted that the chemical delivery system 500 described above may be used with different solutions other than as presented. For example, different solutions, such as SC1, citric acid, ammonium hydroxide, and ammonium citrate may be used in place of the hydrogen fluoride solution and deionized water.

It should also be noted that while the above description illustrates the use of the present invention in a cleaning system 400 in which both sides of the substrate are scrubbed, the present invention may be used in other cleaning systems and processes. For example, a cleaning system in which only a single side of the substrate is scrubbed.

Thus, a Method and Apparatus for HF—HF Cleaning has been described. Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An apparatus for a brush assembly comprising:
    a brush for scrubbing a semiconductor substrate, wherein the brush has a core, the core having a space therein;
    a rotation device, wherein the rotation device rotates the brush; and
    a solution delivery system, the solution delivery system disposed to deliver a solution to the space in the core, the solution delivery system having:
        a mixing manifold, wherein the mixing manifold delivers a mixed solution to the space in the core of the brush;
        a first delivery tube coupled to a first pressure regulator and a first flow meter, wherein the first delivery tube delivers a first solution at a first pressure and a first flow rate to the mixing manifold;
        a second delivery tube coupled to a second pressure regulator and a second flow meter, wherein the second delivery tube delivers a second solution at a second pressure and a first flow rate to the mixing manifold.

2. The apparatus as described in claim 1 wherein the brush is a PVA brush.

3. The apparatus as described in claim 1 wherein the first solution is comprises HF and the second solution comprises deionized water.

* * * * *